(12) United States Patent
Wu

(10) Patent No.: US 6,548,362 B1
(45) Date of Patent: Apr. 15, 2003

(54) METHOD OF FORMING MOSFET WITH BURIED CONTACT AND AIR-GAP GATE STRUCTURE

(75) Inventor: Shye-Lin Wu, Hsinchu (TW)

(73) Assignee: Texas Instruments-Acer Incorporated, Hsinchu (TW)

( * ) Notice: Subject to any disclaimer, the term of this patent is extended or adjusted under 35 U.S.C. 154(b) by 0 days.

(21) Appl. No.: 09/325,811

(22) Filed: Jun. 4, 1999

Related U.S. Application Data

(63) Continuation-in-part of application No. 09/083,610, filed on May 22, 1998, now abandoned.

(51) Int. Cl.[7] .................. H01L 21/336; H01L 21/3205; H01L 21/4763
(52) U.S. Cl. ............... 438/304; 438/305; 438/596
(58) Field of Search .................. 438/304, 305, 438/596, 619, 182, 183

(56) References Cited

U.S. PATENT DOCUMENTS

| | | | | |
|---|---|---|---|---|
| 4,728,621 A | * | 3/1988 | Graf et al. | |
| 5,604,218 A | * | 9/1991 | Lee | |
| 5,736,446 A | * | 4/1998 | Wu | |
| 5,770,507 A | * | 6/1998 | Chen et al. | |
| 6,087,208 A | * | 7/2000 | Krivokapic et al. | |
| 6,127,232 A | * | 10/2000 | Chatterjee et al. | |
| 6,130,121 A | * | 10/2000 | Sze | |

* cited by examiner

*Primary Examiner*—John F. Niebling
*Assistant Examiner*—Ron Pompey

(57) ABSTRACT

A method of forming MOSFET with buried contacts and air-gap gate structure is disclosed. The method comprises following steps firstly, a gate is formed of pad oxide layer and a nitride layer sequentially on a silicon substrate, which has trench isolations. Then, a polysilicon layer and an oxide layer are deposited in order on all areas. Subsequently, an etched-back using the nitride layer a stopping layer is achieved. After that the nitride layer is removed thereby, forming a gate hollow region. After the pad oxide layer is removed, an oxynitride layer is regrown to be as the gate oxide. Thereafter, a silicon is deposited on all areas and refills in the gate hollow region. A planarization process is again performed using the oxide layer as an etch-stopping layer. Subsequently, the oxide layer is removed. S/D/G ion implanted into the polysilicon layer and the silicon layer. Then, the nitride spacers are removed to form dual recessed spaces. Another ion implantation is undertaken into first doped region and in a second doped region, which is in the bottom of the dual recessed spaces. A CVD oxide layer is then deposited on all areas and seals the dual recessed regions and forms the air-gaps. Finally an annealing process is carried out to form the shallow S/D, extended S/D junctions, and the buried contacts.

20 Claims, 5 Drawing Sheets

US 6,548,362 B1

METHOD OF FORMING MOSFET WITH BURIED CONTACT AND AIR-GAP GATE STRUCTURE

CROSS-REFERENCE TO RELATED APPLICATIONS

The invention is a continuation-in-part of the application filed on May 22, 1998, with an application Ser. No. 09/083,610 now abandoned, assigned to same assignee but under different title, as shown above.

FIELD OF THE INVENTION

The present invention relates to a semiconductor device process, and more specifically, to a method to form a MOSFET with buried contacts and air-gap gate structure.

BACKGROUND OF THE INVENTION

Recently, the rapid progression of the microelectronic technology demands devices with high speed and capable of operating at a lower voltage to lessen power consumption, as well as to reduce the cost per unit chip. Generally, the method to approach such purpose is to scale the device dimension down. For example, for a CMOS device, as it is scaling to 0.1 µm and operating at 1V range, is known to have the speed enhancement of about 3X performance than the 0.35 µm device operates at 3.3V. However, in short-channel MOSFETs, the stringent issues such as hot carrier effects, punchthrough effects, parasitic resistance, etc., are required to be overcome.

In addition, the parasitic capacitance—the gate fringe capacitor ($C_{FR}$), around the gate electrode of a MOSFET and the junction capacitance ($C_J$)-are difficult to reduce. The larger values of the parasitic capacitance give longer RC delay time.

Hence, for realizing high speed and low-power ULSI, minimizing parasitic capacitance is demanded. The $C_{OV}$, the capacitance between source/drain and the gate, and $C_J$ can be reduced by adjusting the sidewall thickness, and by self-aligned counter well doping, or by implanting a channel impurity locally around the gate electrode, as is stated in the paper by M. Togo, et al., titled "A Gate-side Air-gap Structure (GAS) to Reduce the Parasitic Capacitance in MOSFETs", Symp. On VLSI Tech. Dig., p. 38 (1996). Besides, Togo et al. also proposed that the transistor with gate-side air-gap structure (GAS) could be used to minimize the $C_{FR}$. The GAS in which a 5-nm-wide air gap formed next to the gate is found to reduce the fringe capacitance by half. Hence the gate delay time is reduced by 4.8 psec at fan out=1 and 16 psec at fan out=3 in a 0.25 µm CMOS, and the power consumption is lowered compared to a conventional structure. In addition, the GAS structure can not be found to degrade electrical characteristics or reliability, as is depicted in the paper.

The fabrication of the GAS structure as proposed by Togo is shown in FIGS. 1(a)–(d), and will be restated as the following: After the gate is etched, a 20 nm wide $Si_3N_4$ sidewall is fabricated (FIG. 1(a)). Next, a 50 nm thickness $SiO_2$ is formed, and is followed by etching back (FIG. 1(b)). After that, the $Si_3N_4$ sidewall is removed by a wet etching to form the air gaps (FIG. 1(c)), and 50 nm thick $SiO_2$ layer is then deposited to form the air-gap cap and is etched back (FIG. 1(d)).

SUMMARY OF THE INVENTION

The method comprises the following steps: First, a silicon substrate having trench isolations is provided so that an active region is defined. After a pad oxide layer and a nitride layer are sequentially formed on the silicon substrate, a gate region is defined by patterning the nitride layer and the pad oxide layer. For forming the buried contacts, a polysilicon layer is formed on all areas. Subsequently, a CVD oxide layer is then deposited on the polysilicon layer followed by etching back using the nitride layer in the gate region as an etch stopping layer. After the nitride layer in the gate region is removed using hot $H_3PO_4$, thereby, a gate hollow region results. After that, the nitride spacer formation on the sidewalls of the gate hollow region is performed. For improving the electrical properties of the gate oxide, the pad oxide layer in the gate hollow region is removed and substituted by regrowing a nitrogen-rich gate oxide. Thereafter, an α-Si layer is deposited on all areas and refills in the gate hollow region, a planarization process using the CVD oxide layer as an etch-stopping layer then follows. Subsequently, the CVD oxide layer is removed using the polysilicon layer as an etch-stopping layer. A low energy, high dose S/D/G implant is then performed. After removing the nitride spacers, another low energy medium dose is implanted into all areas so as to form extended S/D regions beneath the resulting dual-recessed spaces, which is previously occupied by the nitride spacers. Subsequently, another CVD oxide layer is deposited on all areas and sealed the dual-recessed spaces to form air gaps. Finally, a high temperature thermal anneal is performed so as to form source/drain junctions and the extended source/drain junctions by driving the conductive impurities into the silicon substrate. Concurrently, the remnant polysilicon layer serves as the buried contact.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method for fabricating a MOS transistor with buried contact and air-gap gate structure on a semiconductor substrate is disclosed. The detailed processes will be described as follows.

Figure 1A:
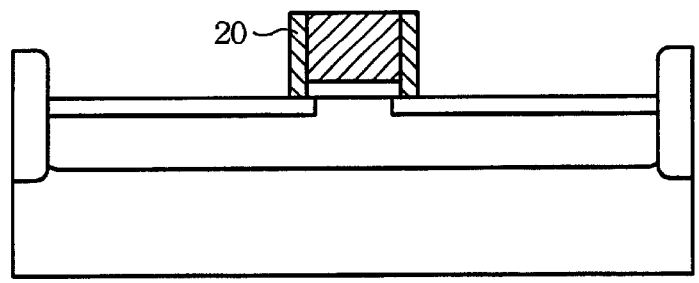
FIGS. 1(a)–(d) is a cross-sectional view of a MOSFET with GAS structure in accordance with the prior art.
Figure 1B:
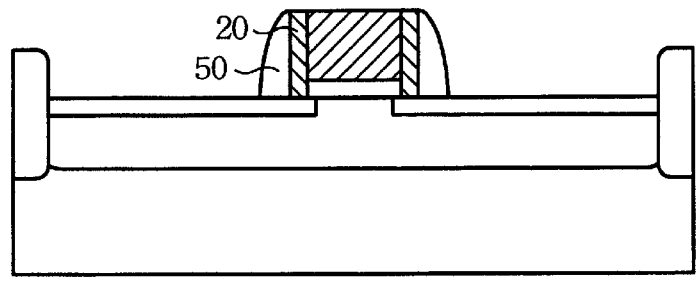
Figure 1C:
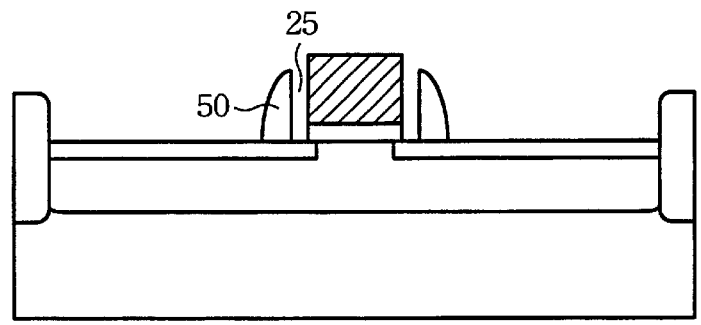
Figure 1D:
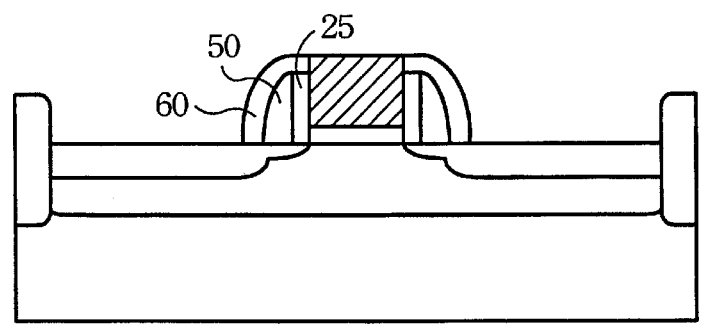
Figure 2:
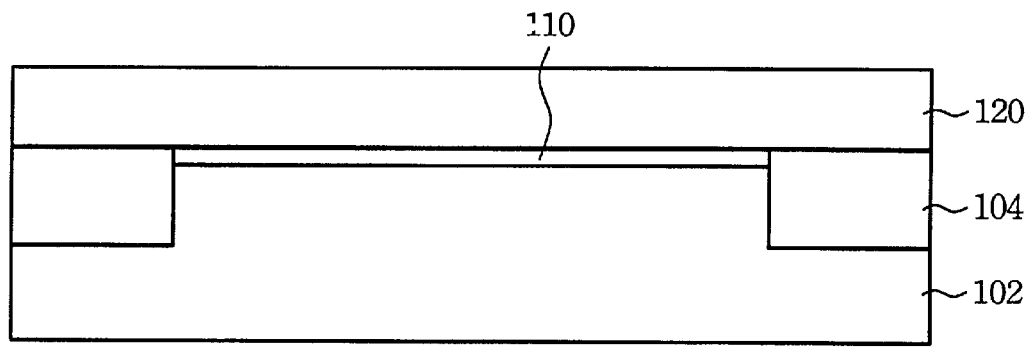
FIG. 2 is a cross-sectional view of a deposition of a pad oxide/nitride layer on a silicon substrate in accordance with the present invention.

FIG. 2 shows a cross-sectional view of a pad oxide layer 110 and a thick nitride 120 layer sequentially formed on a <001> orientation silicon substrate 102, which has shallow trench isolation (STI) regions 104 for isolating the active regions. In a preferred embodiment, the pad oxide 110 is formed by a CVD deposition method or by a thermal oxidation at a temperature of about 700–1050° C. The nitride layer 120 is deposited by a method such as low-pressure CVD (LPCVD) at about 600–800° C. to a thickness of about 100–300 nm.

Figure 3:
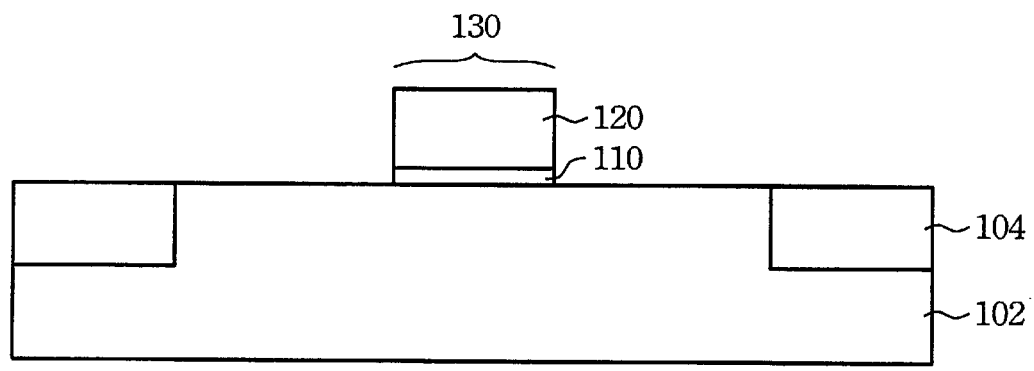
FIG. 3 is a cross-sectional view of forming a gate region on the substrate in accordance with the present invention.

Referring to FIG. 3, a photoresist (not shown) is deposited via a lithography technology to define a gate region 130. A dry etching method, such as a plasma etching or a reactive ion etching (RIE) method is performed to form the gate reigon 130. Preferably, the dry etching is used to remove away unmasked portions by using the thin pad oxide layer 110 as an etch-stopping layer, and then follow by a wet etching to etch the remnant pad oxide 110 so that the damage occurring during the etching process can be minimized.

Figure 4:
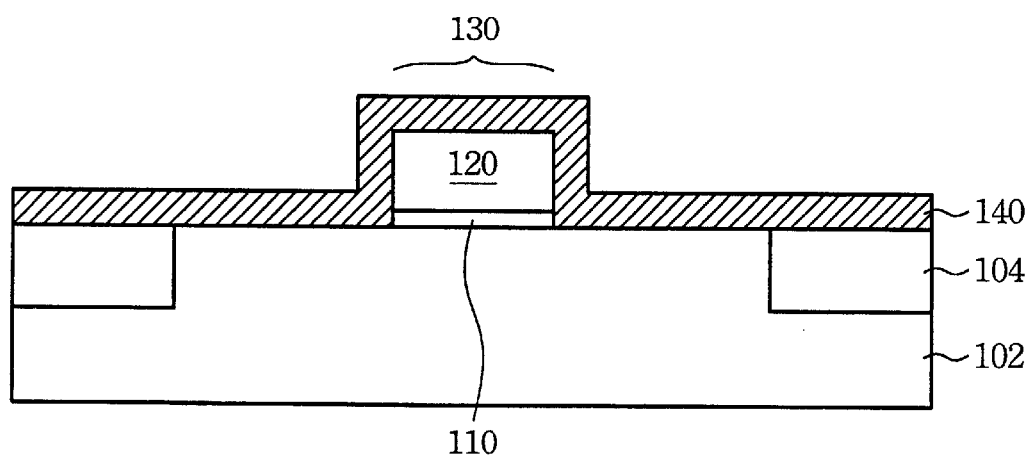
FIG. 4 is a cross-sectional view of deposited an undoped polysilicon layer on all areas in accordance with the present invention.

Subsequently, as shown in FIG. 4, an undoped polysilicon layer 140 is formed on the gate region 130 and elsewhere on the substrate 102. Preferably, the formation of the polysilicon layer 140 is achieved at a temperature of about 550–650° C. by LPCVD. The thickness of the polysilicon layer 140 is about 30–150 nm.

Figure 5:
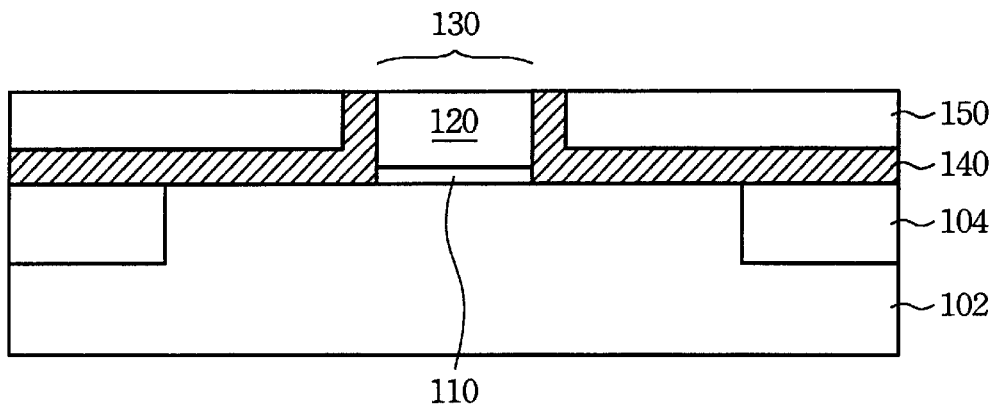
FIG. 5 is a cross-sectional view of deposited a CVD oxide layer on the polysilicon layer followed by a CMP in accordance with the present invention.

Please see FIG. 5, an oxide layer 150 is formed on the resulting surface of the polysilicon layer 140 by a CVD method. Then an etch-back process by CMP (chemical/mechanical polish) is performed using the nitride layer 120 as an etch-stopping layer.

Figure 6:
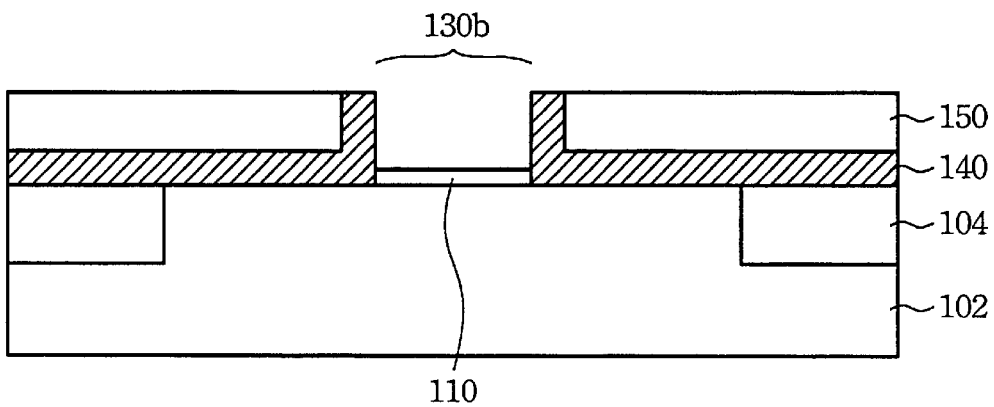
FIG. 6 is a cross-sectional view of removing the nitride layer to form a gate hollow region in accordance with the present invention.

Referring to FIG. 6, the nitride layer 120 in the gate region 130 is then removed by hot $H_3PO_4$ solution so that a gate hollow region 130b with the pad oxide layer 110 as bottom layer is left.

Figure 7:
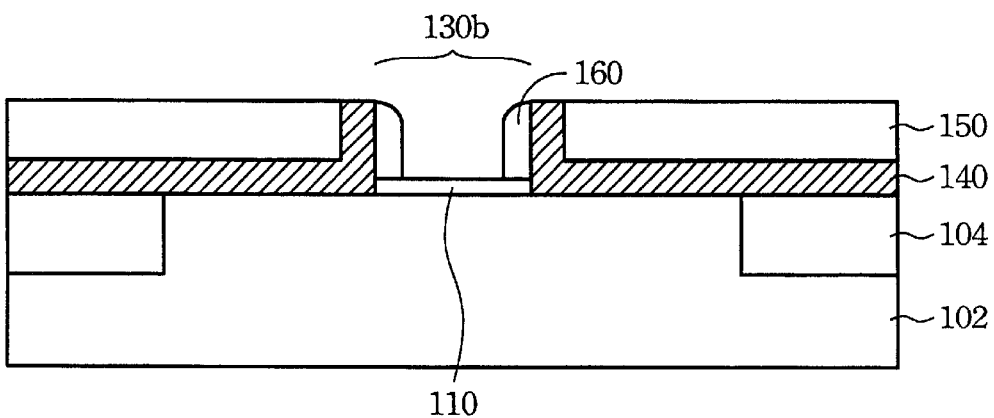
FIG. 7 is a cross-sectional view of forming nitride spacers on sidewalls of the gate hollow region in accordance with the present invention.

Referring to FIG. 7, nitride spacers 160 are formed on the sidewalls of the gate hollow region 130b by forming a thin nitride layer (not shown) using a LPCVD method on the resulting surface, and then performing an anisotropic etch. The thin nitride spacers 160 are about 10–100 nm in thickness.

Figure 8:
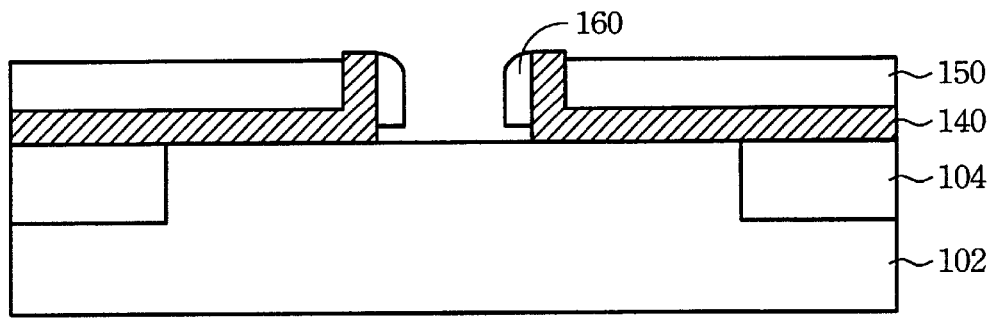
FIG. 8 is a cross-sectional view of removing pad oxide layer in accordance with the present invention.

Referring to FIG. 8, a removal of the pad oxide layer 110 is performed using an isotropic wet etch such as, diluted HF solution or buffer oxide etching solution (BOE) solution.

Figure 9:
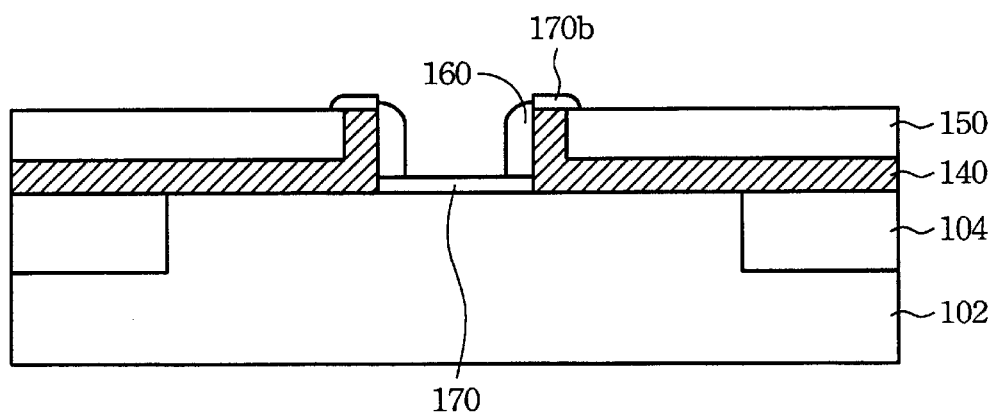
FIG. 9 is a cross-sectional view of forming a nitrogen rich gate oxide layer in accordance with the present invention.

FIG. 9, shows an ultra thin nitrogen rich gate oxide 170 and a polyoxide layer 170b grown on the bottom of the gate hollow region 130b and the exposed portion of the undoped polysilicon layer 140 in a $N_2$ ambient but with diluted $O_2$, $N_2O$ or NO. Preferably, the ratio for $O_2:N_2$ is about 1:99 or 2:98, and the regrown temperature is about 700–1100° C. to about 2–20 nm in thickness.

Figure 10:
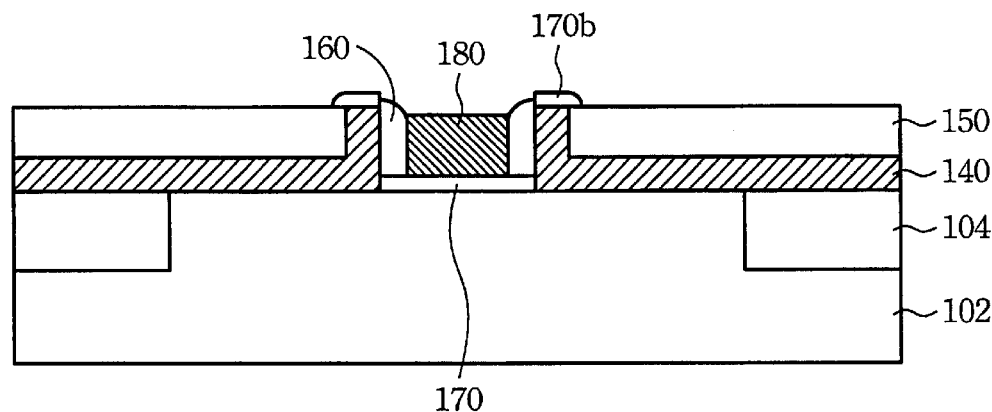
FIG. 10 is a cross-sectional view of performing an α-Si deposition to refill the gate hollow region in accordance with the present invention.

Referring to FIG. 10, for the purpose of better step coverage, an undoped amorphous silicon layer 180 (hereafter called α-SI layer) is deposited on all areas and refills in the hollow region 130b. Preferably, a PECVD method is conducted at a temperature of about 400 to 560° C. Then, another etch back process by CMP or a dry etch is performed using the oxide layer 150 as an etch-stopping layer.

Figure 11:
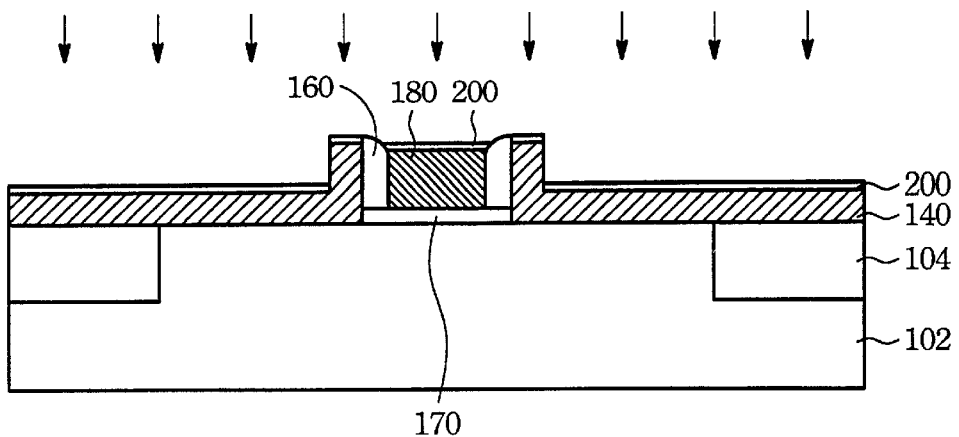
FIG. 11 is a cross-sectional view of performing an ion implant on all areas to form doped layer in the polysilicon layer and in the α-Si region in accordance with the present invention.

Turning to FIG. 11, after the oxide layer 150 is removed by BOE solution or dilute HF, a low energy, heavy dose, source/drain/gate (S/D/G) implant (indicated by arrows direction) into polysilicon layer 140 and α-Si 180 by conductive impurities is followed. For nMOS, the conductive ions, such as $As^+$ or $P^+$, is preferred; however for pMOS, the conductive ions, is preferred using $BF_2^+$. The energy and the dosage are about 0.5–150 keV and about $10^{15}$–$5\times10^{16}/cm^2$, respectively. The doped regions 200 are shown in the figure.

Figure 12:
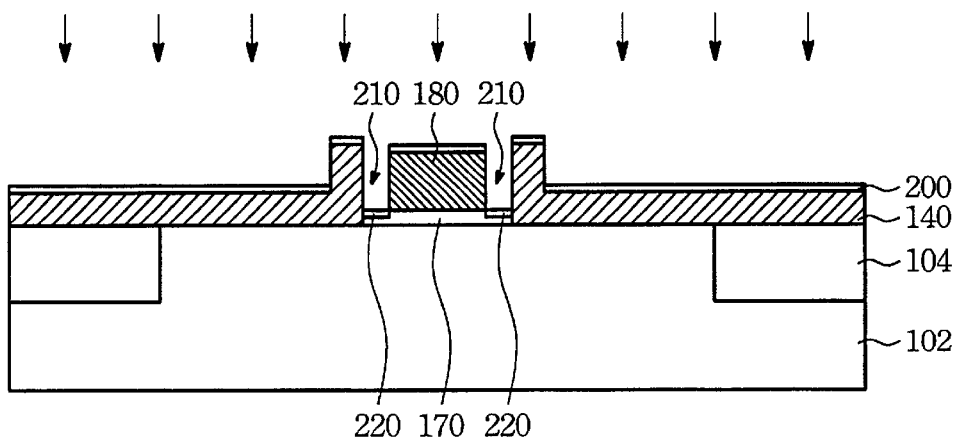
FIG. 12 is a cross-sectional view of performing a removal of nitride spacer to form a dual recessed region and then performing extended S/D ion implant in accordance with the present invention.

Referring to FIG. 12, for forming extended S/D regions (not shown), the nitride spacers 160 are removed firstly to become a dual-recessed space 210 and then a low energy, medium dose implant into all areas includes prior doped regions 200 and the recessed doped regions 220 is performed. In the preferred embodiment, for NMOS, the dose and energy for arsenic, or phosphorus ion implant are about 0.5–50 keV and $5\times10^{13}$ –$2\times10^{15}/cm^2$, respectively. For pMOS, the conductive ions, is preferred using $BF_2^+$.

Figure 13:
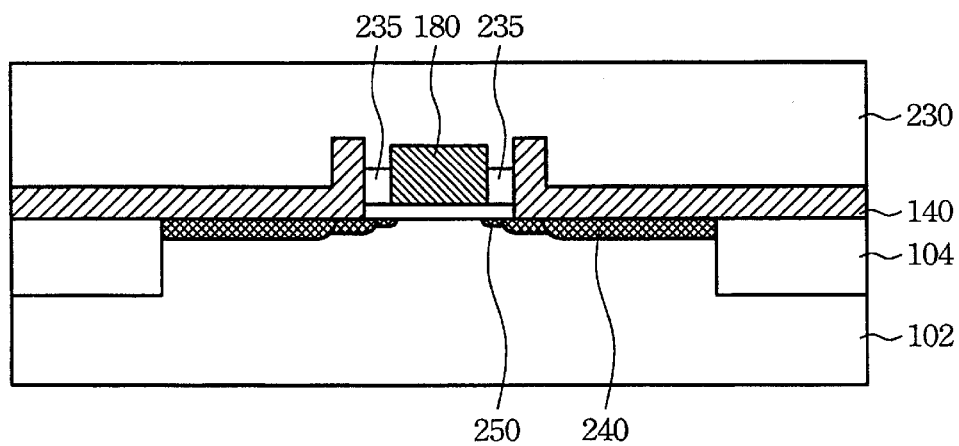
FIG. 13 is a cross-sectional view of forming an CVD oxide layer to seal the dual recessed region so as to form air gaps in the gate structure and to form S/D junction, extended S/D junction in accordance with the present invention.

Subsequently, referring to FIG. 13, a thick CVD oxide layer 230 of about 100–500 nm is deposited on all regions and concurrently formed the air-gaps 235 seals the recessed spaces 210. The oxide layer 230 is formed by a method selected from LPCVD, TEOS LPCVD and PECVD methods. For forming shallow source/drain (S/D) junctions 240 and extended S/D junctions 250, a high temperature annealing at a temperature of about 800–1100° C. for 0.1–100 min is performed. The impurities are driven in both lateral and longitudinal into interior of the silicon substrate 102 and are activated. The L-shaped and mirror L-shaped doped polysilicon layer 140 underlying the CVD oxide 230 is then served as buried contact so as to shrink the device area since the interconnect plugs can formed on the STI 104 without occupying the S/D areas 240.

The benefits of the invention include:
1) The ultra-short channel MOSFET can be achieved in terms of clarity to define the gate hollow.
2) The device speed is improved due to reduce the parasitic resistance by the extended source/drain junction and lessen the parasitic $C_{FR}$ and $C_{OV}$ by the air-gaps gate structure
3) The feature size of MOSFET is reduced due to the facts that the buried contacts are formed on both the source/drain and the STI region.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claim is:

1. A method of forming MOSFET with buried contacts and air-gap gate structure, said method comprising the steps of:

providing a silicon substrate having trench isolations, thereby, defining an active region thereon;

forming a gate region on said active region, said gate region being formed sequentially by patterning a pad oxide layer and a nitride layer on said silicon substrate forming a polysilicon layer on said gate region and elsewhere of said silicon substrate;

forming a first dielectric layer on said polysilicon layer;

etching back said first dielectric layer using said nitride layer of said gate region as an etch stopping layer;

removing said nitride layer of said gate region thereby, forming a gate hollow region;

forming nitride spacers on sidewaslls of said gate hollow region;

removing said pad oxide layer in said gate hollow region;

forming a gate dielectric layer on said gate hollow region;

depositing a silicon layer on all areas and refilled in said gate hollow region;

performing a planarization process using said first dielectric layer as an etch-stopping layer;

removing said first dielectric layer using said polysilicon layer as an etch-stopping layer;

performing a first ion implantation into all areas by conductive impurities to form first doped region in said polysilicon layer and said silicon layer;

removing said nitride spacers to form dual recessed spaces;

performing a second ion implantation into all areas by said conductive impurities in said first doped region and in a second doped region which is in bottom of said dual recessed spaces;

forming a second dielectric layer on all areas and sealing said dual recessed spaces to form air gaps in said dual recessed spaces; and annealing said silicon substrate so as to form source/drain junctions by driving said conductive impurities of said first doped region into said silicon substrate, and form extended source/drain junctions by driving said conductive impurities of said second doped region into said silicon substrate, said remnant polysilicon layer serving as said buried contact.

2. The method of claim 1, wherein said nitride layer is deposited by LPCVD to a thickness of about 100–300 nm.

3. The method of claim 1, wherein said first dielectric is an oxide layer.

4. The method of claim 1, wherein said gate dielectric layer is a nitride-rich oxide with a thickness of about 2–20 nm, and said nitrogen rich oxide is formed in an ambient selected from a ratio range consisting of $O_2:N_2=1:99$ to $O_2:N_2=2:98$.

5. The method of claim 1, wherein said silicon layer is an amorphous silicon and is formed by a PECVD method at a temperature of about 400–560° C.

6. The method of claim 1, wherein said first ion implantation is implanted by using an energy and a dosage of about 0.5–150 keV and of about $10^{15}$ to $5\times10^{16}/cm^2$, respectively.

7. The method of claim 1, wherein said second ion implantation is implanted by using an energy and a dosage of about 0.5–50 keV and of about $5\times10^{13}$ to $2\times10^{15}/cm^2$, respectively.

8. The method of claim 1, wherein said steps of forming nitride spacers comprises the steps of:

forming a thin nitride layer on all areas; and performing an anisotropic etching so as to form said nitride spacers.

9. The method of claim 8, wherein said nitride spacers is about 10–100 nm in thickness.

10. The method of claim 1, wherein said second dielectric layer is an oxide layer deposited by a method selected from the group consisting of LPCVD, TEOS LPCVD and PECVD to a thickness about 100–500 nm.

11. The method of claim 1, wherein said steps of annealing said silicon substrate is performed at a temperature of about 800–1100° C. for 0.1–100 min.

12. A method of forming MOSFET with buried contacts and air-gap gate structure, said method comprising the steps of:

providing a silicon substrate having trench isolations, thereby, defining an active region thereon;

forming a pad oxide layer on said active region and said trench isolations;

forming a nitride layer on said pad oxide layer;

forming a gate region on said active region by patterning said nitride layer and said pad oxide layer through a photoresist pattern and an anisotropic etching technique;

forming a polysilicon layer on said gate region and elsewhere of said silicon substrate;

forming a first oxide layer on said polysilicon layer;

etching back said first oxide layer using said nitride layer of said gate region as an etch stopping layer;

removing said nitride layer of said gate region thereby, forming a gate hollow region;

forming nitride spacers on sidewaslls of said gate hollow region;

removing said pad oxide layer of said gate hollow region;

forming a gate dielectric layer on said gate hollow region;

depositing a silicon layer on all areas and refilled in said gate hollow region;

performing a planarization process using said first oxide layer as an etch-stopping layer;

removing said first oxide layer using said polysilicon layer as an etch-stopping layer;

performing a first ion implantation into all areas by conductive impurities so that said polysilicon layer and said silicon layer contain said conductive impurities;

removing said nitride spacers to form recessed spaces;

performing a second ion implantation into all areas by said conductive impurities so that said polysilicon layer, said silicon layer, and said gate dielectric in said recessed space contain said conductive impurities;

forming a second oxide layer on all areas and sealing said recessed space to form air gaps in said recessed space; and annealing said silicon substrate so as to form source/drain junctions and said extended source/drain junctions by driving said conductive impurities into said silicon substrate, said remnant polysilicon layer serving as said buried contact.

13. The method of claim 12, wherein said gate dielectric layer is a nitride-rich oxide with a thickness of about 2–20 nm, and said nitrogen rich oxide is formed in an ambient selected from a ratio range consisting of $O_2:N_2 =1:99$ to $O_2:N_2 =2:98$.

14. The method of claim 12, wherein said silicon layer is an amorphous silicon and is formed by a PECVD method at a temperature of about 400–560° C.

15. The method of claim 12, wherein said first ion implantation is implanted by using an energy and a dosage of about 0.5–150 keV and of about $10^{15}$ to $5\times10^{16}/cm^2/cm^2$, respectively.

16. The method of claim 12, wherein said second ion implantation is implanted by using an energy and a dosage of about 0.5–50 keV and of about $5\times10^{13}$ to $2\times10^{15}/cm^2$, respectively.

17. The method of claim 12, wherein said steps of forming said nitride spacers comprising the steps of:

forming a thin nitride layer on all areas; and performing an anisotropic etching so as to form said nitride spacers.

18. The method of claim 17, wherein said nitride spacers is about 10–100 nm in thickness.

19. The method of claim 12, wherein said second oxide layer is deposited by a method selected from the group consisting of LPCVD, TEOS LPCVD and PECVD to a thickness about 100–500 nm.

20. The method of claim 12, wherein said steps of annealing said silicon substrate is performed at a temperature of about 800–1100° C. for 0.1–100 min.

* * * * *